United States Patent
Yamane

(10) Patent No.: US 9,252,334 B2
(45) Date of Patent: Feb. 2, 2016

(54) LIGHT EMITTING ELEMENT

(71) Applicant: Nichia Corporation, Anan-shi, Tokushima (JP)

(72) Inventor: Naoyuki Yamane, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 14/696,039

(22) Filed: Apr. 24, 2015

(65) Prior Publication Data

US 2015/0311395 A1 Oct. 29, 2015

(30) Foreign Application Priority Data

Apr. 25, 2014 (JP) .................... 2014-090839
Apr. 17, 2015 (JP) .................... 2015-084660

(51) Int. Cl.
- H01L 33/00 (2010.01)
- H01L 33/38 (2010.01)
- H01L 33/42 (2010.01)

(52) U.S. Cl.
CPC .............. *H01L 33/385* (2013.01); *H01L 33/42* (2013.01)

(58) Field of Classification Search
CPC ......... H01L 33/00; H01L 33/32; H01L 33/62; H01L 33/486; H01L 2924/01079
USPC .................... 257/13, 99, 79; 438/28
See application file for complete search history.

(56) References Cited

U.S. PATENT DOCUMENTS

| | | | |
|---|---|---|---|
| 2004/0004223 A1* | 1/2004 | Nagahama | B82Y 20/00 257/74 |
| 2006/0231852 A1 | 10/2006 | Kususe et al. | |
| 2007/0131941 A1 | 6/2007 | Tanaka et al. | |
| 2011/0031519 A1* | 2/2011 | Hirao | H01L 21/6835 257/98 |
| 2012/0326118 A1 | 12/2012 | Nitta | |
| 2013/0092962 A1* | 4/2013 | Paek | H01L 33/62 257/88 |
| 2014/0159083 A1* | 6/2014 | Han | H01L 33/38 257/98 |

FOREIGN PATENT DOCUMENTS

| | | |
|---|---|---|
| JP | 10-275934 | 10/1998 |
| JP | 2000-049376 | 2/2000 |
| JP | 2002-232006 | 8/2002 |

(Continued)

*Primary Examiner* — Phuc Dang
(74) *Attorney, Agent, or Firm* — Foley & Lardner LLP

(57) ABSTRACT

A light emitting element includes an insulating substrate; a semiconductor portion disposed on the substrate, the semiconductor portion having an n-type semiconductor layer and a p-type semiconductor layer in order from a substrate side; an n-side electrode electrically connected to the n-type semiconductor layer; and a p-side electrode electrically connected to the p-type semiconductor layer. The semiconductor portion includes a first through portion defined by a first inner surface formed at the semiconductor portion, the first through portion penetrating through the n-type semiconductor layer and the p-type semiconductor layer to expose the substrate. The p-side electrode includes: a p-side light-transmissive member that is connected to the p-type semiconductor layer and extends above the substrate in the first through portion, and a p-side pad portion that is disposed in the first through portion and that is connected to the p-side light-transmissive member above the substrate in the first through portion.

16 Claims, 3 Drawing Sheets

(56) References Cited

FOREIGN PATENT DOCUMENTS

| | | |
|---|---|---|
| JP | 2002-280618 | 9/2002 |
| JP | 2004-071644 A | 3/2004 |
| JP | 2007-123764 A | 5/2007 |
| JP | 2010-040937 | 2/2010 |
| JP | 2013-008817 A | 1/2013 |

* cited by examiner

LIGHT EMITTING ELEMENT

CROSS-REFERENCE TO RELATED APPLICATIONS

The present application claims priority to Japanese Patent Application No. 2014-090839, filed on Apr. 25, 2014, and Japanese Patent Application No. 2015-084660, filed on Apr. 17, 2015, which are incorporated by reference in their entireties.

BACKGROUND OF THE INVENTION

1. Technical Field

The present disclosure relates to a light emitting element having a semiconductor portion.

2. Description of Related Art

A known light emitting element includes an insulating substrate, an n-type semiconductor layer, a p-type semiconductor layer, an n-side pad portion electrically connected to the n-type semiconductor layer, and a p-side pad portion electrically connected to the p-type semiconductor layer (e.g., JP H10-275934 A). In JP H10-275934 A, the p-side pad portion is provided above the p-type semiconductor layer.

However, with the light emitting element according to JP H10-275934 A, light from the semiconductor portion may partially be absorbed by the p-side pad portion or the semiconductor portion. Accordingly, sufficient light extracting efficiency may not be achieved.

Certain embodiments of the present invention have been devised in light of the disadvantageous features as described above, and an object thereof is to provide a light emitting element with high light extracting efficiency.

SUMMARY

In one embodiment, a light emitting element includes: an insulating substrate; a semiconductor portion provided on the substrate, and having an n-type semiconductor layer and a p-type semiconductor layer in order from the substrate side; an n-side electrode electrically connected to the n-type semiconductor layer; and a p-side electrode electrically connected to the p-type semiconductor layer. The semiconductor portion includes a first through portion defined by a first inner surface formed at the semiconductor portion. The first through portion penetrates through the n-type semiconductor layer and the p-type semiconductor layer. Then, the p-side electrode includes a p-side light-transmissive member that is arranged from above the p-type semiconductor layer to above the substrate in the first through portion, and a p-side pad portion connected, above the substrate in the first through portion, to the p-side light-transmissive member.

According to embodiments of the invention, a light emitting element with high light extracting efficiency can be provided.

DETAILED DESCRIPTION OF EMBODIMENT

Figure 1:
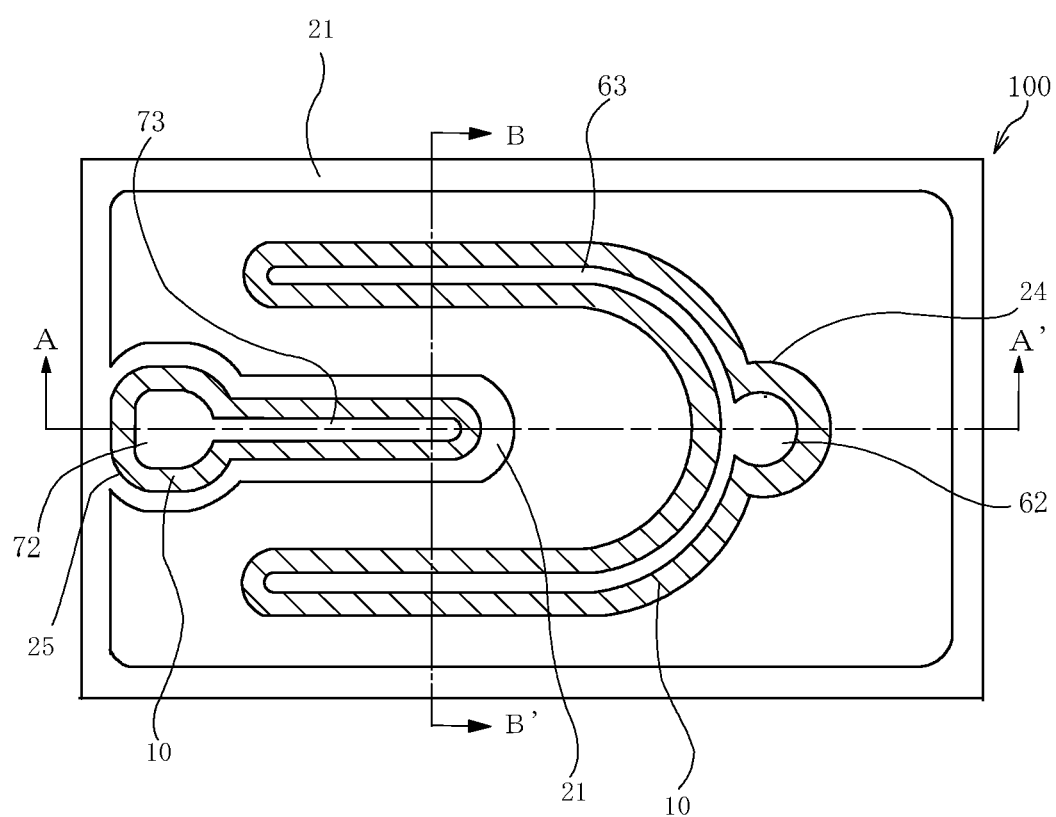
FIG. 1 is a plan view of a light emitting element according to one embodiment of the present invention.

Embodiments of the present invention will be described below with reference to the drawings. Note that, such embodiments are shown by way of illustration for implementing the technical idea of the present invention, and are not intended to limit the present invention thereto. Further, the size or positional relationship of members shown in the drawings may be exaggerated for the sake of clarity. Still further, the identical name and reference sign denote an identical or similar member in principle, and repetitive description will be omitted as appropriate.

FIG. 1 shows a light emitting element 100 according to an embodiment as seen from the upper surface, which serves as the light emitting surface.

Figure 2:
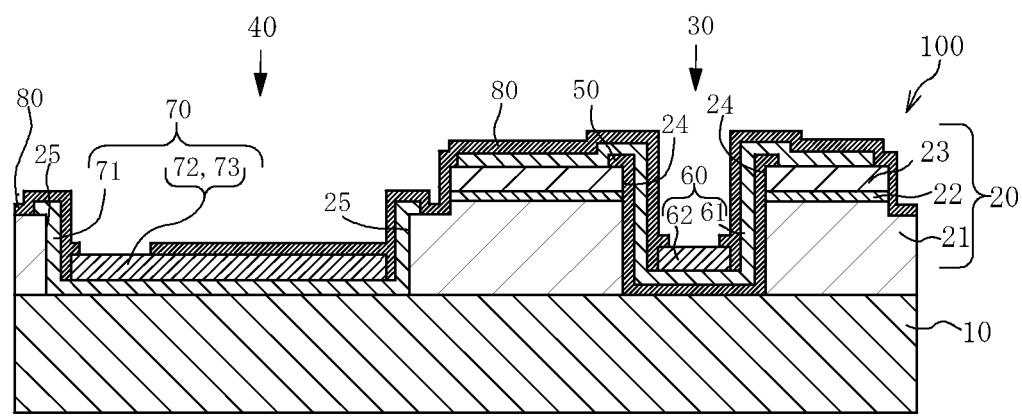
FIG. 2 is a cross-sectional view taken along line A-A' in FIG. 1.
Figure 3:
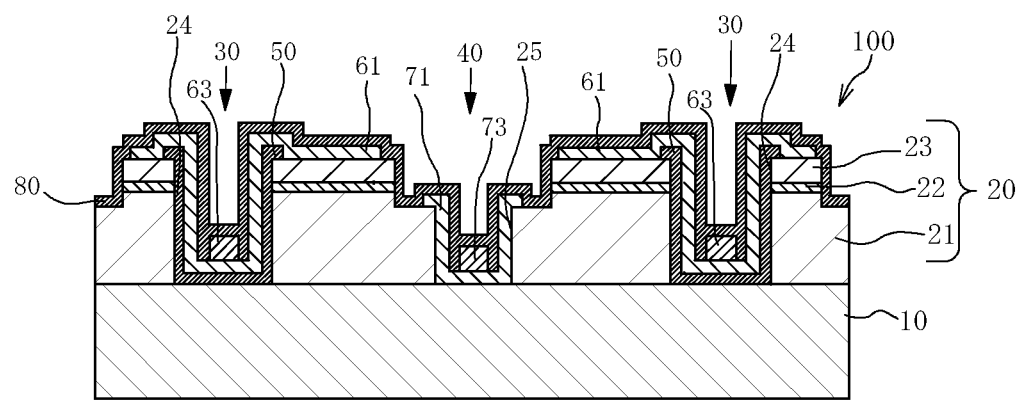
FIG. 3 is a cross-sectional view taken along line B-B' in FIG. 1.

FIG. 2 is a cross-sectional view taken along line A-A' in FIG. 1. FIG. 3 is a cross-sectional view taken along line B-B' in FIG. 1. Here, in FIG. 1, in order to clarify the positional relationship between a region of a substrate 10 exposed in a first through portion 30 and a region where a p-side pad portion 62 is provided, and the positional relationship between a region of the substrate 10 exposed in a second through portion 40 and a region where an n-side pad portion 72 is provided, a second insulating film 80, a p-side light-transmissive member 61 and an n-side light-transmissive member 71 are not shown. Further, in FIG. 3, in order to facilitate understanding of the drawings, the ratio between the lateral length of the semiconductor portion and the length of the through portions is changed from FIG. 1. In the present specification, the substrate 10 side as shown in the figures indicates "a lower side" or "below", and the side opposite to the substrate 10 as shown in the figures indicates "an upper side" or "above".

As shown in the drawings, the light emitting element 100 includes the insulating substrate 10, a semiconductor portion 20 provided on the on the substrate 10 and including an n-type semiconductor layer 21 and a p-type semiconductor layer 23 in this order from the substrate 10 side, and an n-side electrode 70 electrically connected to the n-type semiconductor layer 21, and a p-side electrode 60 electrically connected to the p-type semiconductor layer 23. The semiconductor portion 20 is provided with a first through portion 30 which is defined by a first inner surface 24 provided in the semiconductor portion 20, and the first through portion 30 penetrates through the n-type semiconductor layer 21 and the p-type semiconductor layer 23. The p-side electrode 60 has a p-side light-transmissive member 61 arranged from above the p-type semiconductor layer 23 to above the substrate 10 in the first through portion 30, and a p-side pad portion 62 connected to the p-side light-transmissive member 61 above the substrate 10 in the first through portion 30.

The substrate generally has a refractive index smaller than that of the semiconductor portion, which may cause a portion of light generated in the semiconductor portion to remain in the semiconductor portion while being reflected repeatedly. Such repetitive reflection in the semiconductor portion may result in some part of the light being absorbed by the semiconductor portion (particularly by the active layer), and another part of the light being absorbed by the p-side pad portion. Accordingly, the light emitting element 100 is provided with the first through portion 30 that is defined by the first inner surface 24 in the semiconductor portion 20 and that penetrates through the n-type semiconductor layer 21 and the p-type semiconductor layer 23.

The p-side light-transmissive member 61 extends to the bottom portion of the first through portion 30, and the p-side pad portion 62 is provided to the p-side light-transmissive member 61 at the bottom portion of the first through portion 30. That is, in the light emitting element 100, the p-side pad portion 62 is provided at the bottom portion of the first through portion 30 formed in the semiconductor portion 20, so that the light that would otherwise be absorbed by the semiconductor portion or the p-side pad portion 62 below the p-side pad portion 62 can be extracted to the outside from the first inner surface 24. Accordingly, with the light emitting element 100, an improvement in the light extracting efficiency can be expected.

In the following, with reference to the drawings, a description will be given of main structural components of the light emitting element. Note that, in the present specification, an LED (light emitting diode) is used as the light emitting element 100.

(Substrate 10)

The substrate 10 is for epitaxially growing a semiconductor. The substrate 10 can include an upper surface connected to the semiconductor portion 20 and a side surface adjoining the upper surface. As a material of the substrate 10, an insulating substance such as sapphire or spinel can be used. In the present embodiment, sapphire is used. The refractive index of sapphire is about 1.7, which is smaller than the refractive index of general materials that form the semiconductor portion.

(Semiconductor Portion 20)

As shown in FIG. 2, the semiconductor portion 20 includes, in the order from a lower side upward, the n-type semiconductor layer 21, an active layer 22, and the p-type semiconductor layer 23. More specifically, the n-type semiconductor layer 21 is provided on a predetermined region of the upper surface of the substrate 10. The active layer 22 is provided on a part of the upper surface of the n-type semiconductor layer 21. The p-type semiconductor layer 23 is provided on the entire upper surface of the active layer 22. The semiconductor portion 20 can include a lower surface connected to the substrate 10 and a side surface adjoining the lower surface. The side surface of the substrate 10 and the side surface of the semiconductor portion 20 can substantially be on a same plane.

The materials of the layers that constitute the semiconductor portion 20 are not specifically limited, but in the present embodiment, a nitride semiconductor represented represented by the formula shown below is employed

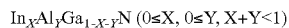

$In_XAl_YGa_{1-X-Y}N$ (0≤X, 0≤Y, X+Y<1)

As shown in the formula, GaN which is a typical example of the nitride semiconductor has a refractive index of about 2.5, which is much larger than the refractive index (1.7) of sapphire which is a typical example of the substrate. Accordingly, it is considered that most of the light generated in the semiconductor portion 20 does not enter the sapphire substrate but instead propagates inside the semiconductor portion 20.

As shown in FIG. 2, the semiconductor portion 20 has the first inner surface 24, and the first inner surface 24 defines the first through portion 30. The first through portion 30 penetrates through the n-type semiconductor layer 21 and the p-type semiconductor layer 23 in the stacking direction of the semiconductor layers. The substrate 10 is exposed at the bottom of the first through portion 30. The hatched regions in FIG. 1 are the portions where the substrate 10 is exposed at the bottom of the first through portion 30. The first through portion 30 can be formed by, for example, etching the semiconductor portion 20.

Further, in the semiconductor portion 20, at a position different from the first through portion 30, the second through portion 40 can be formed to penetrate through the p-type semiconductor layer 23 and the n-type semiconductor layer 21 and expose the substrate 10. The second through portion 40 is defined by a second inner surface 25 in the semiconductor portion 20. In FIG. 1, the hatched regions are the portions where the substrate 10 is exposed at the bottom of the second through portion 40. In more detail, the second through portion 40 can be provided at a portion of the n-type semiconductor layer 21 where the active layer 22 is not formed thereon.

(First Insulating Film 50)

A first insulating film 50 can be disposed on the inner surface 24 that is the side surface of the first through portion 30. As a material of the first insulating film 50, an insulating substance such as $SiO_2$ can be used.

With the formation of the first through hole 30, the n-type semiconductor layer 21, the active layer 22, and the p-type semiconductor layer 23 are exposed at the first inner surface 24, but leakage of electric current can be prevented by covering the n-type semiconductor layer 21, the active layer 22, and the p-type semiconductor layer 23 with the first insulating film 50. Further, with the use of the light-transmissive first insulating film 50, the light generated at the semiconductor portion 20 can be extracted to the outside from the first inner surface 24.

Further, the first insulating film 50 covers not only the first inner surface 24 of the semiconductor portion 20 but also the upper surface of the substrate 10 exposed in the first through portion 30 at the bottom of the first through portion 30. In this case, at the bottom portion of the first through portion 30, the p-side light-transmissive member 61 is provided on the first insulating film 50, and further the p-side pad portion 62 is provided on the p-side light-transmissive member 61.

As the material of the first insulating film 50, a substance whose refractive index is smaller than the refractive index of at least one of, preferably both of, the substrate 10 and the semiconductor portion 20 can be selected. For example, in the case of forming the first insulating film 50 by $SiO_2$, due to the refractive index of $SiO_2$ being approximately 1.5, the first insulating film 50 can be made with a refractive index smaller than the refractive index of the substrate 10 made of sapphire whose refractive index is approximately 1.7. Thus, when the light generated in the semiconductor portion 20 is transmitted to the substrate 10, part of the light propagating from the substrate 10 side toward the p-side pad portion 62 side can be reflected toward the substrate 10 side by the first insulating film 50. Accordingly, the optical absorption by the back surface side of the p-side pad portion 62 can be further prevented.

The thickness of the first insulating film 50 can be 200 nm to 500 nm. The thickness of the first insulating film 50 greater than a certain value can facilitate reflection of light toward the substrate 10, and the thickness of the first insulating film 50 less than a certain value can suppress a reduction in mass productivity.

In the case where the second through portion is formed in the semiconductor portion 20, the first insulating film 50 may further cover the upper surface of the substrate 10 that is exposed in the second through portion 40. In this case also, the effect similar to that described above can be expected.

The first insulating film 50 can be formed as a single layer, or a plurality of layers.

In the case where the first insulating film 50 is formed as a plurality of layers, a DBR (distribution Bragg reflector) film obtained by alternately stacking layers of different refractive index (for example, $SiO_2$ and $Nb_2O_5$) with predetermined thickness can be used. In this case, the light from the semiconductor portion 20 can be effectively reflected by the DBR film.

(P-Side Electrode)

The p-side electrode 60 includes the p-side light-transmissive member 61 and the p-side pad portion 62. The p-side light-transmissive member 61 is connected to the p-type semiconductor layer 23, and disposed from above the p-type semiconductor layer 23 to above the substrate 10 exposed in the first through portion 30. The p-side light-transmissive member 61 serves to conduct current supplied to the p-side pad portion 62 to the p-type semiconductor layer 23. Therefore, it is preferable that the p-side light-transmissive member 61 covers substantially the entire upper surface of the p-type semiconductor layer 23.

The p-side light-transmissive member 61 extends from the upper surface of the p-type semiconductor layer 23, to the upper surface of the first insulating film 50 on the substrate 10 exposed in the first through portion 30. Thus, at the bottom portion of the first through portion 30, the p-side pad portion 62 can be provided on the p-side light-transmissive member 61.

As the material of the p-side light-transmissive member 61, a light-transmitting and electrically conductive substance, such as ITO or IZO, is employed. The thickness of the p-side light-transmissive member 61 can be in a range of, for example, 60 nm to 300 nm.

The p-side pad portion 62 is connected to the p-side light-transmissive member 61, above the substrate 10 exposed in the first through portion 30. The p-side pad portion 62 is formed in the first through portion 30 so that the semiconductor portion 20 does not exist immediately below the p-side pad portion 62, the light generated at the active layer 22 little propagates to the back surface side of the p-side pad portion 62. As a result, the light absorption by the p-side pad portion 62 can be suppressed, whereby the light extracting efficiency of the light emitting element 100 can be improved.

Further, the p-side pad portion 62 is disposed only at the bottom portion of the first through portion 30, and is not disposed at the first inner surface 24. The p-side light-transmissive member 61 is disposed at the first inner surface 24, and the p-side pad portion 62 and the p-type semiconductor layer 23 are electrically connected via the p-side light-transmissive member 61. That is, by disposing the first insulating film 50 and the p-side light-transmissive member 61 in order from the semiconductor portion 20 side on the first inner surface 24, it becomes possible to extract the light generated at the semiconductor portion 20 from the first inner surface 24.

As shown in FIG. 2, the p-side electrode 60 preferably has, above the substrate 10 in the first through portion 30, a p-side extending portion 63 that is connected to the p-side light-transmissive member 61 and that extends from the p-side pad portion 62. The p-side extending portion 63 is divided into two portions at the p-side pad portion, the two portions include straight portions substantially in parallel to one another and tip regions at respective end portions. Such a shape allows current externally supplied to the p-side pad portion 62 to be diffused into the entire light emitting element 100 along the p-side extending portion 63. In this case, the shape of the first through portion 30 in a plan view can correspond to the shapes of the p-side pad portion 62 and the p-side extending portion 63, as shown in FIG. 1. That is, inside the first through portion 30, the p-side pad portion 62 and the p-side extending portion 63 are disposed slightly apart from the first inner surface 24. Thus, the region of the first through portion 30 can be minimized (i.e., the region of the semiconductor portion 20 can be maximized). Therefore, higher light output can be obtained.

The p-side pad portion 62 and the p-side extending portion 63 can be made by metal such as Ti/Rh/W/Au (in this case, Ti is provided on the side nearest to the semiconductor portion 20, and Au is provided on the side farthest from the semiconductor portion 20), Rh/W/Au, RhCr/Pt/Au, Cr/Pt/Ru/Au or the like. Among them, Cr/Pt/Ru/Au is preferable because of its high-strength adhesive with the semiconductor portion 20. Note that, "RhCr" means alloy of Rh and Cr.

(N-Side Electrode)

The n-side electrode 70 can include the n-side light-transmissive member 71 and the n-side pad portion 72. The n-side light-transmissive member 71 is disposed connected to the n-type semiconductor layer 21 and extended from above the n-type semiconductor layer 21 to above the substrate 10 exposed in the second through portion 40. Thus, at the time of operation of the light emitting element 100, the current flows from the semiconductor portion 20 to the n-side light-transmissive member 71.

The n-side light-transmissive member 71 further preferably extends from the upper surface of the n-type semiconductor layer 21 to the upper surface of the substrate 10 exposed in the second through portion 40. This structure makes it possible to provide the n-side pad portion 72 on the n-side light-transmissive member 71 at the bottom portion of the second through portion. In the present embodiment, in a plan view, the upper surface of the n-type semiconductor layer 21 is exposed at the region surrounding the second through portion 40, and the n-side light-transmissive member 71 is electrically connected to the n-type semiconductor layer 21 both at the exposed region of the n-type semiconductor layer 21 and the second inner surface 25. Disposing the n-side light-transmissive member 71 not only on the upper surface of the n-type semiconductor layer 21 but also on the side surface of the second through portion 40 that is on the second inner surface 25, a wide contact area between the n-type semiconductor layer 21 and the n-side light-transmissive member 71 can be obtained This reduces the contact resistance, and therefore Vf (forward voltage) of the light emitting element 100 can be reduced. The material and thickness of the n-side light-transmissive member 71 which are similar to those of the p-side light-transmissive member 61 can be employed.

The n-side pad portion 72 is disposed in contact with the n-side light-transmissive member 71 over the substrate 10 exposed in the second through portion 40. In the present embodiment, the n-side pad portion 72 is disposed in the second through portion 40 so that the semiconductor portion 20 does not exist immediately below the n-side pad portion 72, the light generated at the active layer 22 little propagates to the back surface side of the n-side pad portion 72. As a result, absorption of light by the n-side pad portion 72 can be suppressed, whereby the light extracting efficiency of the light emitting element 100 can be improved.

Further, as shown in FIG. 2, the n-side electrode 70 preferably has an n-side extending portion 73 that is connected to the n-side light-transmissive member 71 and is extended from the n-side pad portion 72, above the substrate 10 exposed in the second through portion 40. When the light emitting element 100 is seen from above, the n-side extending portion 73 can extend toward the p-side pad electrode 62. Further, when the light emitting element 100 is seen from above, the n-side extending portion 73 can be disposed between the tip regions of the p-side extending portion 63. Such a shape allows the current which is externally supplied through the n-side pad portion 72 to be diffused into the entire light emitting element 100 along the n-side extending portion 73. In this case, the shape of the second through portion 40 in a plan view can correspond to the shapes of the n-side pad portion 72 and the n-side extending portion 73 as shown in FIG. 1. That is, inside the second through portion 40, the n-side pad portion 72 and the n-side extending portion 73 are disposed slightly apart from the second inner surface 25. Thus, the region of the first through portion 40 can be minimized (i.e., the region of the semiconductor portion 20 can be maximized). Therefore, higher light output can be obtained.

Further, the n-side pad portion 72 is disposed only at the bottom portion of the second through portion 40, and is not provided at the second inner surface 25. The n-side light-transmissive member 71 is disposed at the second inner surface 25, and the n-side pad portion 72 and the n-type semiconductor layer 21 are electrically connected via the n-side light transmissive member 71 That is, by providing the n-side light-transmissive member 71 on the second inner surface 25, it becomes possible to extract the light generated at the semiconductor portion 20 from the second inner surface 25.

(Second Insulating Film)

It is preferable that the surface of exposed portions of the semiconductor portion 20, the p-side light-transmissive member 61, the n-side light-transmissive member 71, the p-side extending portion 63, and the n-side extending portion 73 is covered by the second insulating film 80. Further, as shown in FIG. 2, as to the p-side pad portion 62 and the n-side pad portion 72, the surfaces of these portions except for the part connected to the outside via a wire or the like is preferably covered by the second insulating film 80. Thus, each of the members can be protected from being damaged or soiled. The second insulating film 80 can be made of the material similar to that of the first insulating film 50 with a thickness, for example, in a range of 30 nm to 500 nm.

REFERENCE NUMERALS IN THE DRAWINGS 100 light emitting element
10 substrate
20 semiconductor portion
21 n-type semiconductor layer
22 active layer
23 p-type semiconductor layer
24 first inner surface
25 second inner surface
30 first through portion
40 second through portion
50 first insulating film
60 p-side electrode
61 p-side light-transmissive member
62 p-side pad portion
63 p-side extending portion
70 n-side electrode
71 n-side light-transmissive member
72 n-side pad portion
73 n-side extending portion
80 second insulating film

What is claimed is:

1. A light emitting element comprising:
   an insulating substrate;
   a semiconductor portion disposed on the substrate, the semiconductor portion having an n-type semiconductor layer and a p-type semiconductor layer in order from a substrate side;
   an n-side electrode electrically connected to the n-type semiconductor layer; and
   a p-side electrode electrically connected to the p-type semiconductor layer,
   wherein the semiconductor portion includes a first through portion defined by a first inner surface formed at the semiconductor portion, the first through portion penetrating through the n-type semiconductor layer and the p-type semiconductor layer to expose the substrate, and
   wherein the p-side electrode includes:
      a p-side light-transmissive member that is connected to the p-type semiconductor layer and extends above the substrate in the first through portion, and
      a p-side pad portion that is disposed in the first through portion and that is connected to the p-side light-transmissive member above the substrate in the first through portion.

2. The light emitting element according to claim 1, wherein:
   the semiconductor portion includes a second through portion defined by a second inner surface formed at the semiconductor portion, the second through portion penetrating through the p-type semiconductor layer and the n-type semiconductor layer to expose the substrate, and
   the n-side electrode includes:
      an n-side light-transmissive member that is connected to the n-type semiconductor layer and extends above the second through portion, and
      an n-side pad portion that is disposed in the second through portion and that is connected to the n-side light-transmissive member above the substrate in the second through portion.

3. The light emitting element according to claim 1, wherein:
   the p-side electrode further includes a p-side extending portion above the substrate in the first through portion, and
   the p-side extending portion is connected to the p-side light-transmissive member and extends from the p-side pad portion.

4. The light emitting element according to claim 2, wherein:
   the n-side electrode further includes an n-side extending portion above the substrate in the second through portion, and
   the n-side extending portion is connected to the n-side light-transmissive member and extends from the n-side pad portion.

5. The light emitting element according to claim 3, wherein the first through portion has a shape corresponding to the p-side pad portion and the p-side extending portion.

6. The light emitting element according to claim 4, wherein the second through portion has a shape corresponding to the n-side pad portion and the n-side extending portion.

7. The light emitting element according to claim 1, wherein the first inner surface is covered by a first insulating film that has a refractive index smaller than a refractive index of the semiconductor portion.

8. The light emitting element according to claim 7, wherein, in the first through portion, the substrate is covered with the first insulating film that has a refractive index smaller than a refractive index of the substrate.

9. The light emitting element according to claim 1, wherein:
   the substrate includes an upper surface connected to the semiconductor portion and a side surface adjoining the upper surface,
   the semiconductor portion includes a lower surface connected to the substrate and a side surface adjoining the lower surface, and
   the side surface of the substrate and the side surface of the semiconductor portion are substantially on a same plane.

10. The light emitting element according to claim 4, wherein, when the light emitting element is viewed from above, the n-side extending portion extends toward the p-side pad electrode.

11. The light emitting element according to claim 2, wherein:
the p-side electrode further includes a p-side extending portion above the substrate in the first through portion, and
the p-side extending portion is connected to the p-side light-transmissive member and extends from the p-side pad portion.

12. The light emitting element according to claim 11, wherein:
the n-side electrode further includes an n-side extending portion above the substrate in the second through portion, and
the n-side extending portion is connected to the n-side light-transmissive member and extends from the n-side pad portion.

13. The light emitting element according to claim 12, wherein the first through portion has a shape corresponding to the p-side pad portion and the p-side extending portion.

14. The light emitting element according to claim 13, wherein the second through portion has a shape corresponding to the n-side pad portion and the n-side extending portion.

15. The light emitting element according to claim 12, wherein, when the light emitting element is viewed from above, the n-side extending portion extends toward the p-side pad electrode.

16. The light emitting element according to claim 15, wherein:
the p-side extending portion is divided into two portions at the p-side pad portion,
the two portions include straight portions substantially in parallel to one another and tip regions at respective end portions, and
the n-side extending portion is disposed between the tip regions.

* * * * *